US008329590B2

(12) United States Patent
Condrashoff et al.

(10) Patent No.: US 8,329,590 B2
(45) Date of Patent: Dec. 11, 2012

(54) PLASMA PROCESSING APPARATUS AND METHODS FOR REMOVING EXTRANEOUS MATERIAL FROM SELECTED AREAS ON A SUBSTRATE

(75) Inventors: Robert S. Condrashoff, Walnut Creek, CA (US); James D. Getty, Vacaville, CA (US); James S. Tyler, Galt, CA (US)

(73) Assignee: Nordson Corporation, Westlake, OH (US)

( * ) Notice: Subject to any disclaimer, the term of this patent is extended or adjusted under 35 U.S.C. 154(b) by 364 days.

(21) Appl. No.: 12/614,551

(22) Filed: Nov. 9, 2009

(65) Prior Publication Data

US 2010/0075505 A1 Mar. 25, 2010

Related U.S. Application Data

(62) Division of application No. 11/003,062, filed on Dec. 3, 2004, now Pat. No. 7,635,418.

(51) Int. Cl.
*H01L 21/302* (2006.01)

(52) U.S. Cl. .............. 438/710; 216/11; 216/41; 216/45; 216/57; 216/67; 438/689; 438/706; 438/729; 438/731

(58) Field of Classification Search .................. None
See application file for complete search history.

(56) References Cited

U.S. PATENT DOCUMENTS

| 4,534,921 A | 8/1985 | Fierkens et al. |
| 4,599,970 A | 7/1986 | Peterson |
| 5,208,067 A | 5/1993 | Jones et al. |
| 5,297,897 A | 3/1994 | Venrooij et al. |
| 5,529,636 A | 6/1996 | Nohara et al. |
| 5,961,860 A | 10/1999 | Lu et al. |
| 6,082,375 A | 7/2000 | Gealy et al. |
| 6,230,719 B1 | 5/2001 | Wensel |
| 6,417,028 B2 | 7/2002 | Wensel |
| 6,450,074 B1 | 9/2002 | Yong-Chang |
| 6,455,479 B1 | 9/2002 | Sahbari |
| 6,576,867 B1 | 6/2003 | Lu et al. |
| 6,629,880 B1 | 10/2003 | Kang et al. |
| 6,632,746 B2 | 10/2003 | Kanegae et al. |
| 6,652,799 B2 | 11/2003 | Seng et al. |
| 6,750,082 B2 | 6/2004 | Briar et al. |
| 6,815,362 B1 | 11/2004 | Wong et al. |
| 6,858,086 B2 | 2/2005 | Kang |
| 7,028,696 B2 | 4/2006 | Richardson et al. |
| 7,282,452 B2 | 10/2007 | Kanegae et al. |
| 2001/0012681 A1 | 8/2001 | Wensel |

(Continued)

OTHER PUBLICATIONS

H. Xiao, Introduction to Semiconductor Manufacturing Technology, published by Prentice Hall, 2001, ISBN 0-13-022404-9, pp. 328-342.*

(Continued)

*Primary Examiner* — Lan Vinh
*Assistant Examiner* — Jiong-Ping Lu
(74) *Attorney, Agent, or Firm* — Wood, Herron & Evans, LLP

(57) ABSTRACT

Apparatus and methods for shielding a feature projecting from a first area on a substrate to a plasma while simultaneously removing extraneous material from a different area on the substrate with the plasma. The apparatus includes at least one concavity positioned and dimensioned to receive the feature such that the feature is shielded from the plasma. The apparatus further includes a window through which the plasma removes the extraneous material. The method generally includes removing the extraneous material while shielding the feature against plasma exposure.

9 Claims, 3 Drawing Sheets

U.S. PATENT DOCUMENTS

| | | |
|---|---|---|
| 2001/0032706 A1 | 10/2001 | Wensel |
| 2002/0013061 A1* | 1/2002 | Siniaguine et al. ........... 438/706 |
| 2002/0031622 A1 | 3/2002 | Ippel et al. |
| 2002/0032940 A1 | 3/2002 | Sato |
| 2002/0037819 A1 | 3/2002 | Sahbari |
| 2003/0005943 A1 | 1/2003 | Singh et al. |
| 2003/0045025 A1 | 3/2003 | Coyle et al. |
| 2003/0101932 A1 | 6/2003 | Kang |
| 2003/0127502 A1 | 7/2003 | Alvarez |
| 2003/0193091 A1 | 10/2003 | Yu et al. |
| 2004/0053445 A1 | 3/2004 | Briar et al. |
| 2004/0106234 A1 | 6/2004 | Sorg et al. |
| 2004/0220066 A1 | 11/2004 | Rutter |
| 2004/0235303 A1 | 11/2004 | Wong et al. |
| 2004/0244423 A1 | 12/2004 | Boontarika et al. |
| 2005/0221599 A1 | 10/2005 | Kanegae et al. |
| 2005/0287815 A1 | 12/2005 | Lai et al. |
| 2006/0118239 A1 | 6/2006 | Condrashoff et al. |
| 2006/0130873 A1 | 6/2006 | Richardson et al. |
| 2006/0163201 A1 | 7/2006 | Getty et al. |
| 2007/0052132 A1 | 3/2007 | Gutierrez et al. |

OTHER PUBLICATIONS

Intellectual Property Office, Office Action issued in corresponding Taiwan Application No. 094141008 issued Apr. 18, 2012.

* cited by examiner

US 8,329,590 B2

PLASMA PROCESSING APPARATUS AND METHODS FOR REMOVING EXTRANEOUS MATERIAL FROM SELECTED AREAS ON A SUBSTRATE

CROSS-REFERENCE TO RELATED APPLICATIONS

This application is a divisional of application Ser. No. 11/003,062, filed Dec. 3, 2004, which is hereby incorporated by reference herein in its entirety.

FIELD OF THE INVENTION

The invention relates generally to plasma processing, and more particularly, to plasma processing methods and apparatus for selectively removing extraneous material from a substrate.

BACKGROUND OF THE INVENTION

Plasma processing systems are routinely used to modify the surface properties of substrates used in applications relating to integrated circuits, electronic packages, and printed circuit boards. In particular, plasma processing systems are used to treat surfaces in electronics packaging, for example, to increase surface activation and/or surface cleanliness for eliminating delamination and bond failures, improving wire bond strength, ensuring void free underfilling of chips on circuit boards, removing oxides, enhancing die attach, and improving adhesion for die encapsulation. Typically, substrates are placed in the plasma processing system and at least one surface of each substrate is exposed to the plasma. The substrate's outermost atomic layers may be removed from the surface by physical sputtering, chemically-assisted sputtering, chemical reactions promoted by reactive plasma species, and combinations of these mechanisms. The physical or chemical action may also be used to condition the surface to improve properties such as adhesion or to clean undesired contaminants from the substrate surface.

During semiconductor manufacture, semiconductor die are commonly electrically coupled by wire bonds with leads on a metal carrier, such as a lead frame. Lead frames generally include a number of pads each having exposed leads used to electrically couple a single semiconductor die with a circuit board. One semiconductor die is attached to each pad and external electrical contacts of the die are wire bonded with nearby portions of the leads. Each semiconductor die and its wire bonds are encapsulated inside a package consisting of a molded polymer body designed to protect the semiconductor die and wire bonds from the adverse environment encountered during handling, storage and manufacturing processes as well as to dissipate the heat generated from the semiconductor die during operation. The molded packages project as three-dimensional features from one side of the otherwise generally-planar lead frame.

During the molding process, the lead frame and the multiple attached semiconductor die are positioned between two mold halves. One mold half includes numerous concavities each receiving one of the semiconductor die and mimicking the shape and arrangement of the packages. The mold halves are pressed together in an attempt to seal the entrance mouths to the concavities. The molding material, which is injected into the mold, fills the open space inside the concavities for encapsulating the semiconductor die and wire bonds. However, molding material can seep out of the concavities and flow between the mold halves to form thin layers or flash on the exposed portions of the leads. This thin flash has a thickness typically less than about 10 microns. Flash affects the ability to establish high quality electrical connections with the exposed portions of the leads and, hence, with the encapsulated semiconductor die.

Various conventional approaches have been developed for alleviating the effects of flash. Flash may be prevented by covering the backside of the lead frame with tape during the molding process. However, adhesive may be transferred from the tape to the lead frame backside and remain as a residue after the tape is removed. In addition, tapes suitable for this application are relatively expensive, which needlessly contributes to the cost of manufacture. Flash may be removed after molding by mechanical and chemical techniques, or with a laser. These removal approaches also suffer from restrictions on their use. For example, the lead frame is susceptible to damage from mechanical flash removal techniques, such as chemical mechanical polishing. Chemical processes may be ineffective unless highly corrosive chemicals are used, which potentially raises issues of worker safety and waste disposal of the spent corrosive chemicals. Laser removal is expensive due to the equipment costs and leaves a residual carbon residue behind on the lead frame.

There is thus a need for plasma processing systems and methods that can efficiently and effectively remove extraneous amounts of material, such as excess molding material, from an area on a substrate while shielding other areas on the substrate from the plasma.

SUMMARY OF THE INVENTION

Embodiments of the present invention address these and other problems associated with removing extraneous material from an area on a substrate with a plasma without exposing features on other areas on the substrate to the plasma. To that end, the present invention provides a shielding assembly for holding a substrate during treatment with a plasma. The substrate has a first area, a feature projecting from the first area, and a second area covered by an extraneous material. The shielding assembly comprises a first member including a concavity positioned and dimensioned to receive the feature and to shield the feature from the plasma and a second member including a window for passing the plasma into contact with the extraneous material for removing the extraneous material from the second area with the plasma.

One situation in which the shielding assembly of the present invention is particularly beneficial is in removing flash from a lead frame without exposing the molded packages, that project from the otherwise generally-planar lead frame, to the plasma. The semiconductor die inside the semiconductor packages are sensitive to plasma exposure and, therefore, it is desirable to shield the package from the plasma during a plasma deflashing process.

The shielding assembly may be a component of a processing system further including a vacuum chamber enclosing a processing space capable of being evacuated to a partial vacuum, an electrode positioned in the processing space, and a gas port defined in the vacuum chamber for admitting a process gas into the processing space. The system further includes a power supply electrically coupled with the electrode, the power supply operative for converting the process gas to the plasma. The fixture is positioned in the processing space at a location appropriate for plasma treatment.

In another aspect of the invention, a method is provided for plasma treating a substrate having a first area, a feature projecting from the first area, and a second area covered by an extraneous material. The method comprises placing the substrate in a processing space of a vacuum chamber and generating a plasma in the processing space. The first area of the substrate is covered with a shielding assembly having a concavity configured to receive and shield the feature from the plasma. The second area is exposed to reactive species from the plasma effective for removing the extraneous material.

In yet another embodiment, a method is provided for plasma treating a substrate in the processing space of the vacuum chamber. The substrate has a first side, a plurality of features projecting from the first side, a second side opposite to the first side, and an extraneous material on the second side. The method comprises covering the first side of the substrate with a mask having a plurality of concavities each positioned and dimensioned to receive a respective one of the plurality of features projecting from the first side of the first substrate, and sealing about each of the plurality of concavities to prevent the ingress of a plasma into the plurality of concavities. A plasma is generated in the processing space and the second side of the substrate is exposed to the plasma to remove the extraneous material.

These and other objects and advantages of the present invention shall become more apparent from the accompanying drawings and description thereof.

BRIEF DESCRIPTION OF THE FIGURES

The accompanying drawings, which are incorporated in and constitute a part of this specification, illustrate an embodiment of the invention and, together with a general description of the invention given above, and the detailed description given below, serve to explain the principles of the invention.

DETAILED DESCRIPTION OF THE PREFERRED EMBODIMENTS

Figure 1:
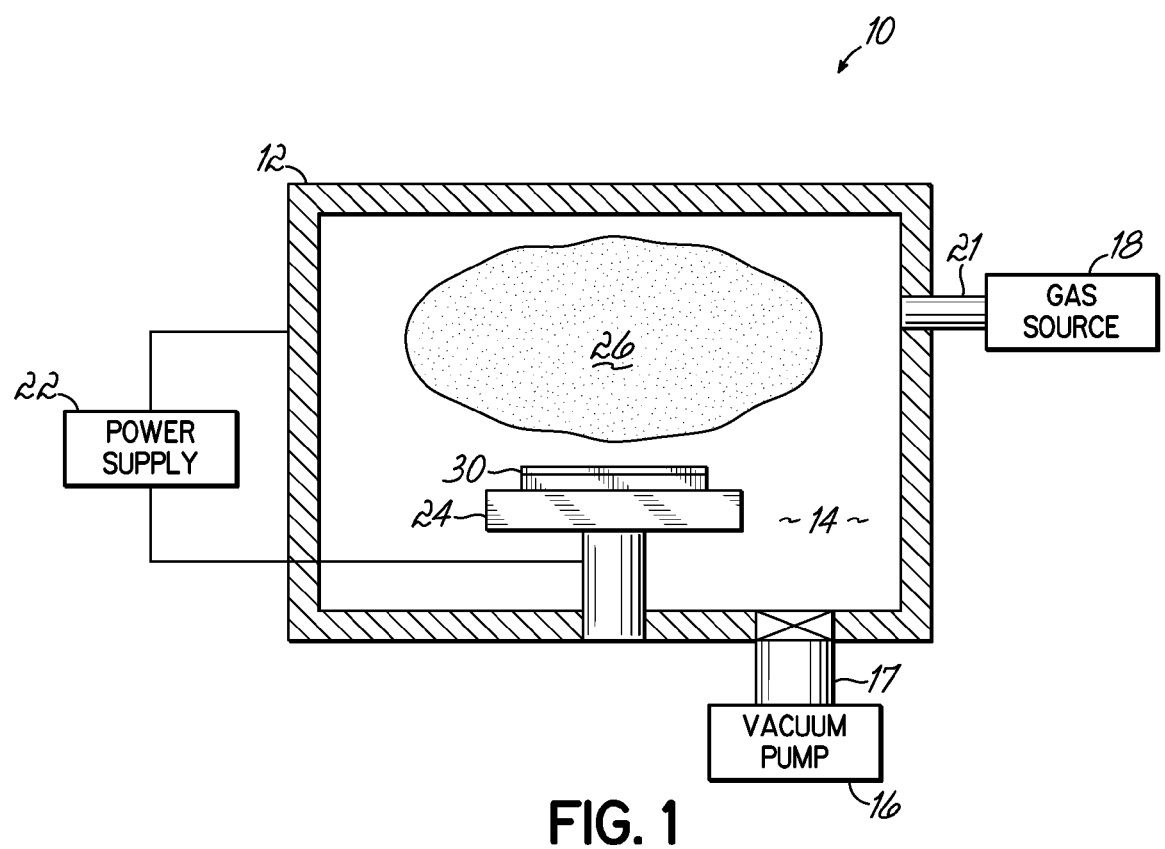
FIG. 1 is a diagrammatic view of a plasma treatment system for plasma treating substrates in accordance with the principles of the present invention.

With reference to the FIG. 1, a plasma treatment system 10 includes a treatment chamber 12 constituted by walls that enclose a processing space 14. During a plasma process, the treatment chamber 12 is sealed fluid-tight from the surrounding ambient environment, evacuated to a suitable partial vacuum, and supplied with a process gas appropriate for the intended plasma treatment. A vacuum pump 16 is used to evacuate the processing space 14 of treatment chamber 12 through a valved vacuum port 17. Vacuum pump 16 may comprise one or more vacuum pumping devices with controllable pumping speeds as recognized by persons of ordinary skill in the art of vacuum technology.

Process gas is admitted at a regulated flow rate to the processing space 14 from a process gas source 18 through an inlet gas port 21 defined in the treatment chamber 12. The flow of process gas from the process gas source 18 to the processing space 14 is typically metered by a mass flow controller (not shown). The gas flow rate from the process gas source 18 and the pumping rate of vacuum pump 16 are adjusted, as needed, to create a processing pressure and environment suitable for plasma generation and suitable for the intended treatment process. Processing space 14 is continuously evacuated simultaneously as process gas is introduced from the process gas source 18 so that fresh gases are continuously exchanged within the processing space 14 when the plasma is present, and any spent process gas and volatile species removed from a substrate 20 are eliminated from the processing space 14.

A power supply 22 is electrically coupled with, and transfers electrical power to, an electrode 24 inside of the treatment chamber 12. Power transferred from the power supply 22 is effective for forming a plasma 26 from the process gas confined within processing space 14 and also controls the direct current (DC) self-bias. Although the invention is not so limited, the power supply 22 may be a radio-frequency (RF) power supply operating at a frequency between about 40 kHz and about 13.56 MHz, preferably about 13.56 MHz, although other frequencies may be used, and a power level, for example, between about 4000 watts and about 8000 watts at 40 kHz or 300 watts to 2500 watts at 13.56 MHz. Those of ordinary skill in the art will appreciate that different treatment chamber designs may permit different bias powers. A controller (not shown) is coupled to the various components of the plasma treatment system 10 to facilitate control of the etch process.

Plasma treatment system 10 may assume different configurations understood by those of ordinary skill in the art and, therefore, is not limited to the exemplary configuration described herein. For example, the plasma 26 may be generated remote of treatment chamber 12 and delivered to the processing space 14. Plasma treatment system 10 is further understood to include components not shown in FIG. 1 that are necessary for operation of system 10, such as a gate valve disposed between the processing space 14 and the vacuum pump 16.

A shield or shielding assembly 30 holds one or more substrates 20 (FIG. 2) in the exemplary treatment system 10 at a position in the processing space 14 of treatment chamber 12 suitable for performing the plasma treatment. Three-dimensional features 28 that project from one side 20a of the substrate 20 and the opposite side 20b of substrate 20 may be approximately planar. The three-dimensional features 28 are to be protected during the plasma treatment and, accordingly, are to be shielded from the plasma 26 during plasma treatment of substrate 20. The invention contemplates that shielding assembly 30 may hold a single substrate 20 for plasma treatment.

Figure 2:
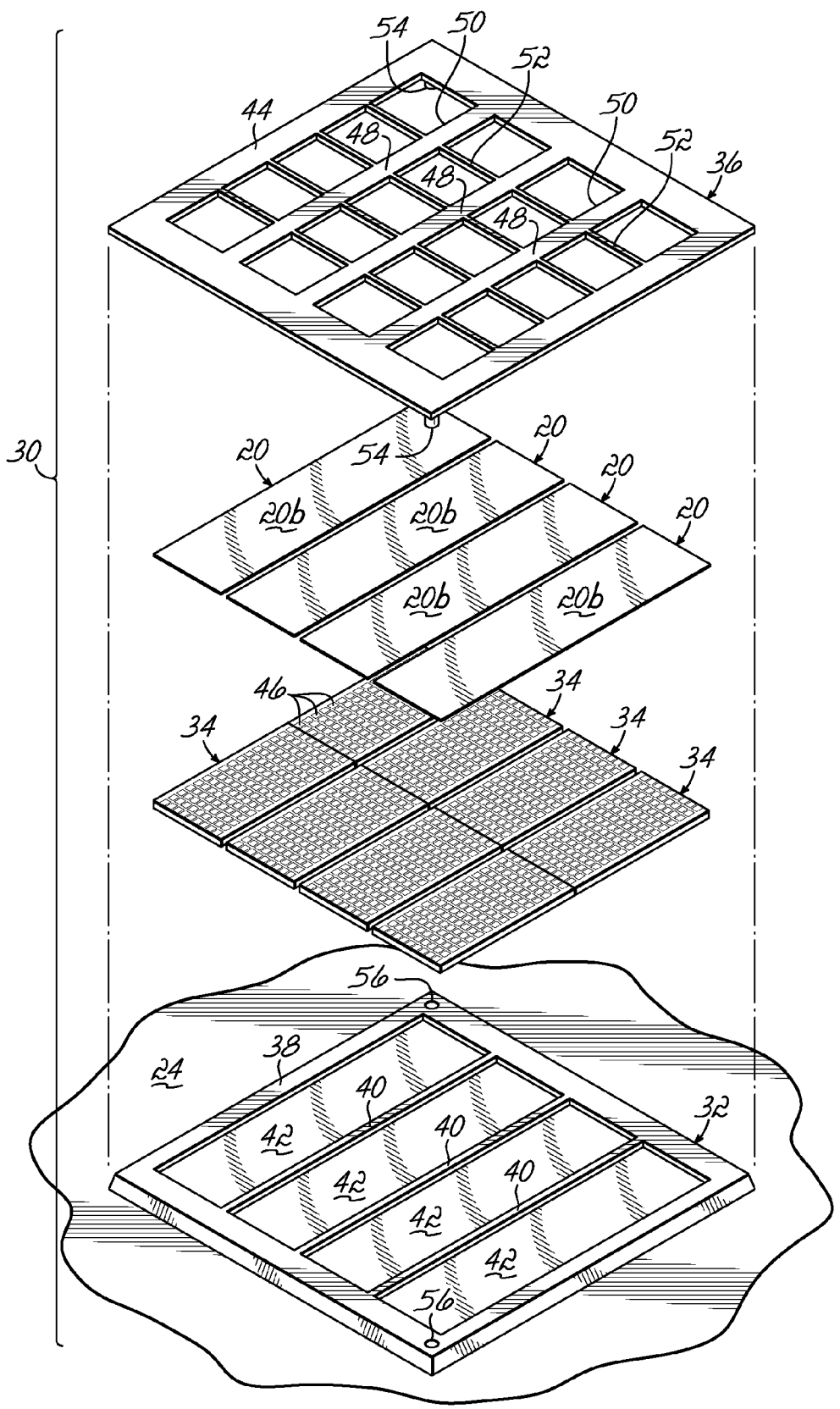
FIG. 2 is an exploded view of a shielding assembly for use with the plasma treatment system of FIG. 1.
Figure 3:
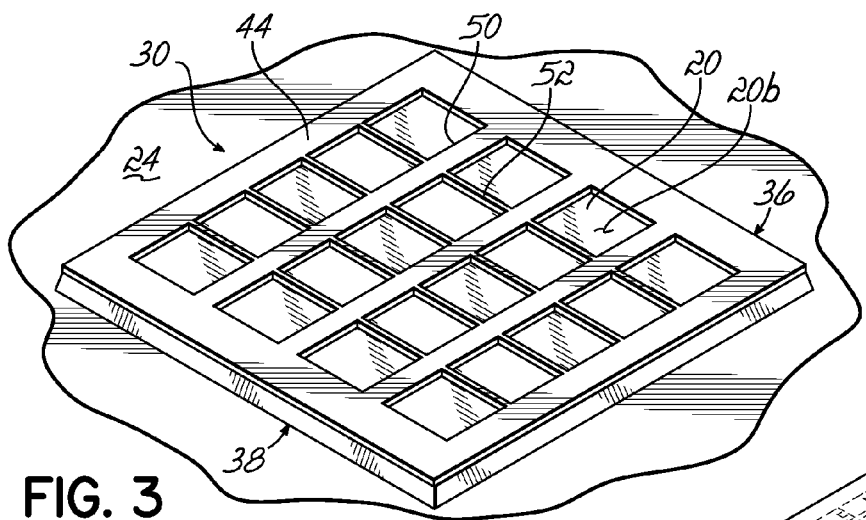
FIG. 3 is a perspective view of the assembled shielding assembly of FIG. 2.
Figure 4:
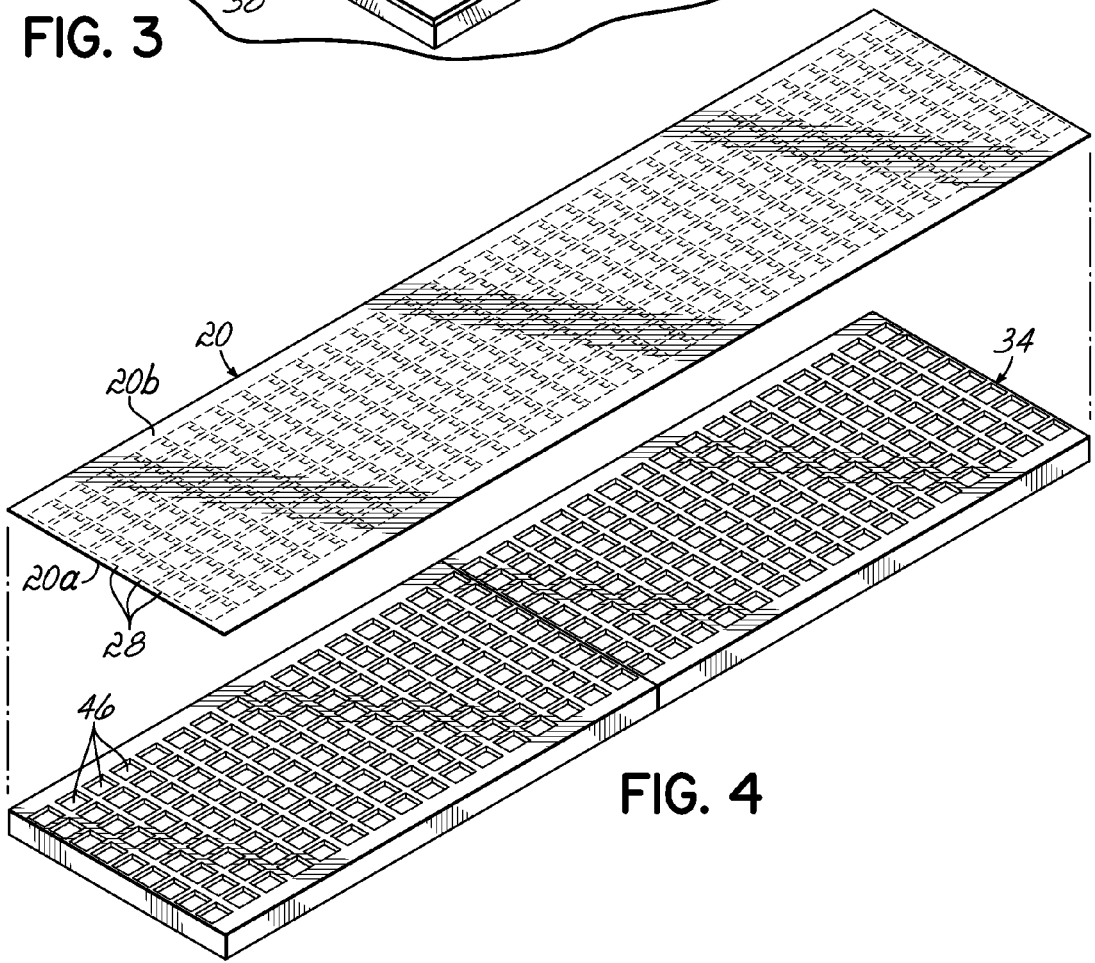
FIG. 4 is a perspective view of the mask of FIG. 2 illustrating the loading of the substrate into the mask.

With reference to FIGS. 2-4, the shielding assembly 30 includes a plurality of first members or masks 34, a second member or upper frame 36, and a third member or lower plate 32 that may rest on the powered electrode 24. Each of the masks 34 is adapted to mask side 20a of a corresponding one of substrates 20 so that the three-dimensional features 28 are shielded from the plasma in processing space 14. The upper frame 36 secures the substrates 20 and masks 34 with the lower plate 32.

The lower plate 32 includes a projecting annular rim 38 and parallel, equally spaced ribs 40 each of which extends between opposite sides of the rim 38. The rim 38 and ribs 40 cooperate to define recesses 42 below a plane defined by the rim 38. Each recess 42 is dimensioned with a length, width, and depth appropriate to receive a single mask 34. After the masks 34 are positioned in the recesses 42 and the substrates 20 are positioned in the shielding assembly 30, an annular peripheral portion 44 of the upper frame 36 may physically contact the rim 38 of lower plate 32 for establishing good electrical and thermal contact. The ribs 40 are generally positioned between adjacent masks 34. The lower plate 32 may be attached to the electrode 24 or, alternatively, may otherwise be positioned in the processing space 14 at a location suitable for plasma processing.

Each mask 34 is constructed with multiple concavities 46 each of which is correlated with the three-dimensional features 28 carried on side 20a of one or more substrates 20. Generally, the concavities 46 are arranged, dimensioned and positioned as the reverse image or complement of three-dimensional features 28 projecting from side 20a. The depth of the concavities 46 is preferably adjusted so that the rim 38 of lower plate 32 contacts the peripheral portion 44 of upper frame 36.

Each mask 34 is oriented spatially with the concavities 46 facing away from the powered electrode 24. One or more substrates 20 are positioned inside each of mask 34 with the concavities 46 and three-dimensional features 28 coincident and registered. As a result, an exposed upper surface 20b of each substrate 20 faces away from the powered electrode 24 and the substrates 20 are oriented such that the three-dimensional features 28 face toward the powered electrode 24.

Each of the concavities 46 has dimensions (length, width, and depth) with sufficient clearance to receive one of the three-dimensional features 28. The concavities 46 may be dimensioned equally or have individual dimensions tailored to accommodate three-dimensional features 28 of differing dimensions across the substrate 20. As a result, each of the concavities 46 defines a seal with the substrate 20 about the perimeter of each three-dimensional feature 28 adequate to prevent the ingress of the plasma 26. The invention contemplates that a single mask 34 may be sufficient to shield the substrates 20 and/or that a single concavity 46 may be effective for shielding the three-dimensional features 28 from the plasma 26. For example, a single mask 34 having a single concavity 46 extending about the periphery of the mask 34 may be effective for shielding the lower surface 20a of the substrates 20 from the reactive species in the plasma 26.

With continued reference to FIGS. 2-4, the upper frame 36 is positioned on the substrates 20 held by the masks 34. The mass of the upper frame 36 applies a downward force that secures the substrates 20 and masks 34 with the lower plate 32. The upper frame 36 includes equidistant parallel ribs 48 extending between two opposite sides of the generally rectangular opening defined inside the annular peripheral portion 44, which divide this space inside the peripheral portion 44 into a plurality of windows 50. When the shielding assembly 30 is assembled, the ribs 48 are generally positioned between adjacent substrates 20. Cross members 52 function to strengthen the upper frame 36 and only cover portions of the substrates 20 for which plasma treatment is not required or desired. The specific location of the cross members 52 will depend upon the arrangement of the three-dimensional features 28 on substrate 20 and will operate to divide the windows 50 into even smaller windows. The present invention contemplates that the upper frame 36 may be constructed to deliberately shield areas of the upper surface 20b of the substrate 20 from the plasma. Key pins 54 in the diagonal corners of the upper frame 36 are registered with corresponding key bores 56 in the lower plate 32, of which only one key bore 56 is visible in FIG. 2, to ensure registration between these components during assembly of the shielding assembly 30.

The lower plate 32, mask 34, and upper frame 36 may be formed from any suitable material, like aluminum, characterized by an acceptable thermal and electrical conductivity. An exemplary mask 34 is formed from a five (5) mm thick sheet of aluminum and the concavities 46 are arranged and positioned at locations corresponding to the arrangement and positioning of the three-dimensional features 28 of the substrate 20.

In an alternative embodiment of the invention, the recesses 42 in the lower plate 32 may be directly formed into the electrode 24. The recesses 42, which serve to prevent lateral movement of the masks 34 and to locate the masks 34 at fixed positions relative to the windows 50 in upper frame 36, may be replaced by any structure capable of preventing lateral movement. Alternatively, if lateral movement of the individual masks 34 relative to the upper frame 36 is not a concern, such as if masks 34 are all coupled together, the lower plate 32 may be omitted in its entirety.

In an exemplary intended use of the plasma treatment system 10, each of the substrates 20 may be a lead frame having semiconductor die encapsulating packages as three-dimensional features 28 and each mask 34 is configured with concavities 46 dimensioned and arranged for masking the packages of the lead frame. The lead frame is plasma treated to remove thin layers of molding material (i.e., flash) created by a molding process during a previous manufacturing stage.

Embodiments of the present invention overcome the various deficiencies of conventional removal techniques as extraneous material is removed from a substrate 20 without resort to wet chemical etching techniques, mechanical techniques, or the use of a laser, and without damaging the substrate 20. The process of the present invention is particularly applicable for removing unwanted thin layers of molding material or flash covering the electrical contacts of a lead frame. Flash results from the molding process encapsulating die carried by the lead frame inside respective packages constituted by the molding material.

In use and with reference to FIGS. 1-5, the masks 34 are positioned in the recesses 42 defined in the lower plate 32, which rests on the powered electrode 24, and are oriented with the concavities 46 facing away from the electrode 24 and lower plate 32. The substrates 20 are then associated with the masks 34 such that the three-dimensional features 28 carried by each substrate 20 are received in the corresponding set of concavities 46. Finally, the upper frame 36 is positioned on the substrates 20 held by the masks 34. The engagement between key pins 54 of the upper frame 36 and the corresponding key bores 56 defined in the lower plate 32 registers the lower plate 32 and upper frame 36 during assembly of the shielding assembly 30.

Figure 5:
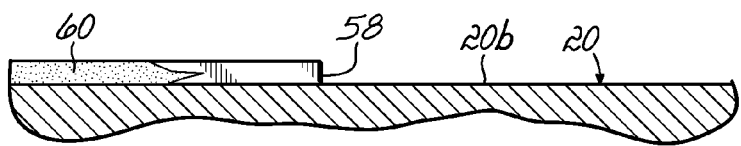
FIG. 5 is a detailed view in partial cross-section of a portion of FIG. 4.

Adjacent to some or all of the three-dimensional features 28 are structures 58, of which one structure 58 is shown in the detailed view of FIG. 5. The structures 58 may be, for example, the exposed electrically conductive leads of a lead frame. Areas 60 on the structure 58 may be covered by a thin layer of extraneous material, such as flash from a molding operation creating a package encapsulating a semiconductor die, that the plasma processing is intended to remove.

After the shielding assembly 30 is assembled, the processing space 14 is then evacuated by vacuum pump 16. A flow of process gas is introduced from process gas source 18 to raise the partial vacuum in the treatment chamber 12 to a suitable operating pressure, typically in the range of about 150 mTorr to about 1200 mTorr, while actively evacuating the processing space 14 with vacuum pump 16. The power supply 22 is energized for supplying electrical power to the electrode 24, which generates plasma 26 in the processing space 14 proximate to the substrate 20 and DC self-biases the electrode 24. The substrate 20 is exposed to reactive species from the plasma 26 in a treatment process suitable for removing the thin layer of extraneous material from the covered areas 60 (FIG. 5) on the substrate 20.

The plasma 26 contains reactive species, including atomic radicals and ions, that interact with material on the surface of the substrate 20 being modified. Extraneous material in covered areas 60 (FIG. 5) of the substrate 20 is transformed by surface reactions with the atomic radicals and ions to a volatile gaseous reaction product that leaves the surface as a gas, which is evacuated from the treatment chamber 12 by the vacuum pump 16. Flash constituted by a variety of different materials, such as different types of molding materials used to encapsulate semiconductor die, may be removed using different plasma compositions. Any surface reaction residue may be removed by providing a different plasma composition.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept.

The scope of the invention itself should only be defined by the appended claims, wherein we claim:

1. A method for plasma treating a substrate in a processing space of the vacuum chamber, the substrate having a first side, a plurality of features projecting from the first side, a second side opposite to the first side, and an extraneous material on the second side, the method comprising:
    covering the first side of the substrate with a mask having a plurality of concavities each positioned and dimensioned to receive a respective one of the plurality of features projecting from the first side of the substrate;
    sealing about each of the plurality of concavities to prevent the ingress of a plasma into the plurality of concavities;
    securing the substrate between the mask and an upper frame having a plurality of windows;
    generating a plasma in the processing space; and
    passing the plasma through the plurality of windows in the upper frame into contact with the extraneous material on the second side of the substrate to remove the extraneous material.

2. The method of claim 1 wherein sealing about each of the plurality of concavities further comprises:
    contacting the mask with the first side of the substrate about the perimeter of each of the concavities.

3. The method of claim 1 further comprising:
    placing the mask, the upper frame, and the substrate on a powered electrode used to generate the plasma in the processing space; and
    orienting the substrate so that the second side of the substrate faces away from the powered electrode.

4. The method of claim 3 further comprising:
    positioning the mask and the substrate into a recess defined in a lower plate so that the substrate and the mask are positioned between the upper frame and the lower plate; and
    establishing electrical and thermal contact between the upper frame and the lower plate.

5. The method of claim 4 wherein the lower plate includes an annular rim projecting toward the upper frame and the recess is defined below a plane containing the annular rim, and wherein establishing the electrical and thermal contact between the upper frame and the lower plate comprises:
    contacting the annular rim with the upper plate to establish the electrical and thermal contact between the upper frame and the lower plate.

6. The method of claim 1 wherein the extraneous material is flash comprised of a molding material.

7. A method for plasma treating a substrate in a processing space of the vacuum chamber, the substrate having a first side, a plurality of features projecting from the first side, a second side opposite to the first side, and an extraneous material on the second side, the method comprising:
    positioning a mask in the processing space, the mask having a plurality of concavities each positioned and dimensioned to receive a respective one of the plurality of features projecting from the first side of the first substrate;
    after the mask is positioned in the processing space, associating the substrate with the mask such that the plurality of features are received in the plurality of concavities with each concavity sealed with the first side of the substrate to prevent the ingress of a plasma into the plurality of concavities;
    generating a plasma in the processing space; and
    exposing the second side of the substrate to the plasma to remove the extraneous material,
    wherein the extraneous material is flash comprised of a molding material.

8. The method of claim 7 further comprising:
    contacting the mask with the first side of the substrate to seal about the perimeter of each of the concavities.

9. The method of claim 7 wherein positioning the mask in the processing space further comprises:
    placing the mask and the substrate on a powered electrode used to generate the plasma in the processing space; and
    orienting the substrate so that the second side of the substrate faces away from the powered electrode.

* * * * *